United States Patent
Wen et al.

(10) Patent No.: US 7,633,127 B2
(45) Date of Patent: Dec. 15, 2009

(54) SILICIDE GATE TRANSISTORS AND METHOD OF MANUFACTURE

(75) Inventors: Cheng-Kuo Wen, Hsin-Chu (TW); Yee-Chia Yeo, Singapore (SG); Hsun-Chih Tsao, Hsin-Chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 11/381,649

(22) Filed: May 4, 2006

(65) Prior Publication Data
US 2006/0194399 A1 Aug. 31, 2006

Related U.S. Application Data

(62) Division of application No. 10/753,632, filed on Jan. 8, 2004, now Pat. No. 7,067,379.

(51) Int. Cl.
*H01L 23/62* (2006.01)
(52) U.S. Cl. ................................ 257/384; 257/E21.619
(58) Field of Classification Search .................. 257/384, 257/E21.619
See application file for complete search history.

(56) References Cited

U.S. PATENT DOCUMENTS

| | | | |
|---|---|---|---|
| 5,960,270 A * | 9/1999 | Misra et al. | 438/197 |
| 6,284,609 B1 | 9/2001 | Ang et al. | |
| 6,406,951 B1 | 6/2002 | Yu | |
| 6,436,747 B1 * | 8/2002 | Segawa et al. | 438/197 |
| 6,465,309 B1 | 10/2002 | Xiang et al. | |
| 6,475,874 B2 | 11/2002 | Xiang et al. | |
| 6,518,154 B1 | 2/2003 | Buynoski et al. | |
| 6,525,378 B1 | 2/2003 | Riccobene | |
| 6,545,324 B2 | 4/2003 | Madhukar et al. | |
| 6,551,885 B1 | 4/2003 | Yu | |
| 6,787,424 B1 * | 9/2004 | Yu | 438/300 |
| 6,878,598 B2 | 4/2005 | Jun et al. | |
| 6,902,994 B2 | 6/2005 | Gong et al. | |
| 2005/0037558 A1 * | 2/2005 | Gong et al. | 438/197 |

OTHER PUBLICATIONS

Tavel, B., et al., "Totally Silicided Polysilicon: A Novel Approach to Very Low-Resistive Gate Without Metal CMP Nor Etching", International Electron Device Meeting (IEDM), Washington, DC, 2001, pp. 825-828.

* cited by examiner

*Primary Examiner*—Bradley K Smith
*Assistant Examiner*—Amar Movva
(74) *Attorney, Agent, or Firm*—Haynes and Boone, LLP (57) ABSTRACT

A method in which a gate and raised source/drain (S/D) regions are fully silicided in separate steps to avoid degrading the resistance or junction leakage is described. A gate dielectric layer, gate, and spacers are formed over a semiconductor layer that is preferably Si, SiGe, or SiGeC on a buried insulator. Raised S/D regions are formed by selective epitaxy between spacers and isolation regions. The gate is protected with a mask while the raised S/D regions are covered with a first metal layer. A first anneal affords fully silicided S/D regions. A dielectric stack is deposited on the substrate and planarized to be coplanar with the top of the spacers. The mask is removed and a second metal layer is deposited. A second anneal yields a fully silicided gate electrode. The invention is also an SOI transistor with silicided raised S/D regions and a fully silicided and optionally recessed gate.

7 Claims, 7 Drawing Sheets

SILICIDE GATE TRANSISTORS AND METHOD OF MANUFACTURE

RELATED APPLICATION

This application is a divisional of U.S. application Ser. No. 10/753,632 filed Jan. 8, 2004 entitled, "Silicide Gate Transistors and Method of Manufacture".

FIELD OF THE INVENTION

The present invention relates to a transistor device that combines the elements of fully silicided metal gates, raised source/drain regions, and a silicon-on-insulator substrate. A method of fabricating the transistor device involves decoupling the silicidation of the source and drain region from the gate silicidation for improved performance.

BACKGROUND OF THE INVENTION

The demand for greater circuit density and higher performance in Complementary Metal Oxide Semiconductor (CMOS) transistors is driving the gate length ($L_G$) to a smaller dimension that is sub –100 nm in size in advanced technologies. Unfortunately, a reduced gate length aggravates the problems of gate depletion, high gate resistance, high gate tunneling leakage current, and boron penetration from a p+ doped gate into the channel region that are associated with polysilicon gates. To reduce the high gate resistance and gate depletion problems, the active dopant density in the polysilicon gate must be increased to a level that is greater than $1.87 \times 10^{20}$ ions/cm$^3$ in a CMOS technology where $L_G$=25 nm for the polysilicon gate depletion layer to be less than 25% of the equivalent oxide thickness (EOT). This requirement presents a tremendous challenge since the active polysilicon dopant density at the interface of the gate and gate dielectric layer is saturated at $6 \times 10^{19}$ ions/cm$^3$ and $1 \times 10^{20}$ ions/cm$^3$, respectively. Insufficient active dopant density in the gate causes a significant voltage drop across the gate depletion layer and increases the EOT. As a result, gate capacitance in the inversion regime and inversion charge density (drive current) is reduced or a lower effective gate voltage occurs, thus compromising device performance.

Because of the shortcomings of polysilicon gates, there is immense interest in metal gate technology which has the advantages of eliminating gate depletion and boron penetration issues and lowering gate sheet resistance. Furthermore, the gate material is much more conductive than conventional heavily doped polysilicon gates. Examples of conductive materials used in metal gate technology are metals such as W and Mo, metal silicides including nickel silicide and cobalt silicide, and metallic nitrides such as TiN and WN.

One attractive approach for implementing a metal gate in a transistor device is to employ a silicidation process that completely consumes a conventional polysilicon gate electrode which is converted to a silicide that contacts the gate dielectric layer. Methods of forming fully silicided gate electrodes for transistors are described in a paper by B. Tavel et. al., entitled "Totally silicided (CoSi$_2$) polysilicon: a novel approach to very low-resistive gate without metal CMP or etching", published at the International Electron Device Meeting (IEDM), Wash. D.C., 2001, pp. 825-828.

Figure 1A:
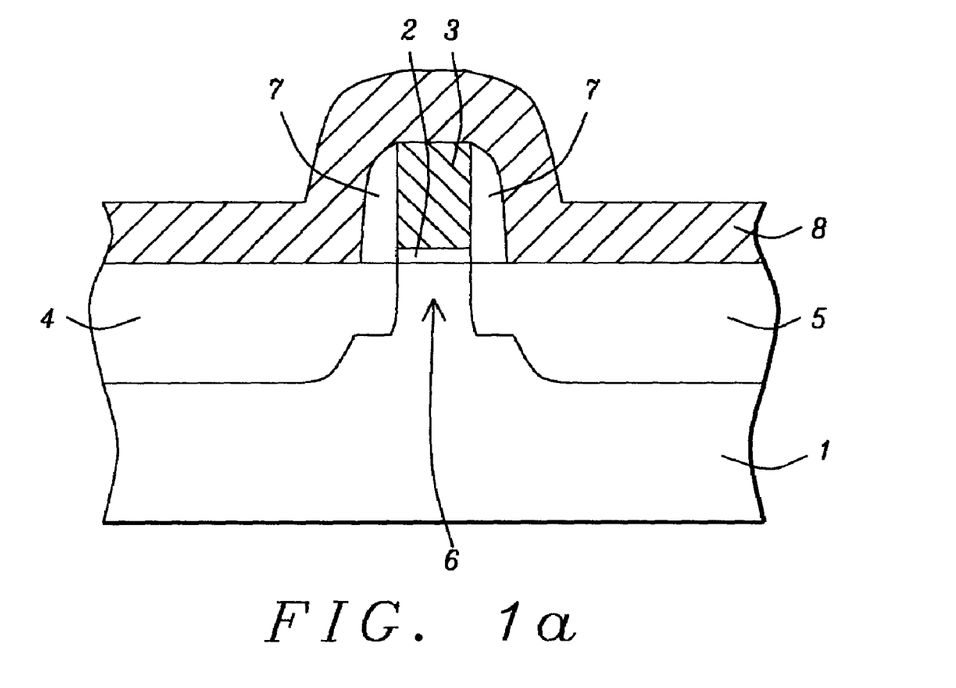
FIGS. 1a and 1b are cross-sectional views that depict the simultaneous silicidation of a gate electrode and source/drain regions in a transistor on a bulk semiconductor substrate according to prior art.
Figure 1B:
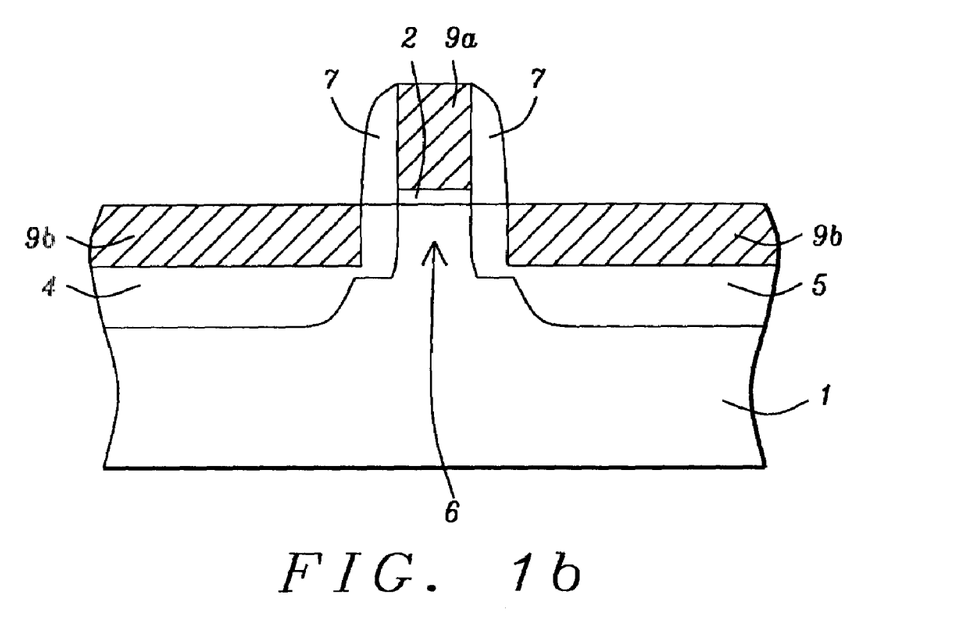

A prior art process of forming a fully silicided gate electrode is shown in FIGS. 1a-1b where the silicidation of the gate and the source/drain regions is performed in one process step. Referring to FIG. 1a, a metal film 8 is deposited over a transistor structure having a polysilicon gate electrode 3, gate dielectric layer 2, and sidewall spacers 7 in addition to a source region 4, a drain region 5, and a channel 6 formed in a substrate 1. Referring to FIG. 1b, an anneal is performed to effect the silicidation process and converts the polysilicon gate into a silicide gate 9a. Additionally, a thick silicide region 9b is formed in source/drain regions 4, 5 which is undesirable since it leads to a transistor that suffers from a high source or drain leakage current.

Figure 2A:
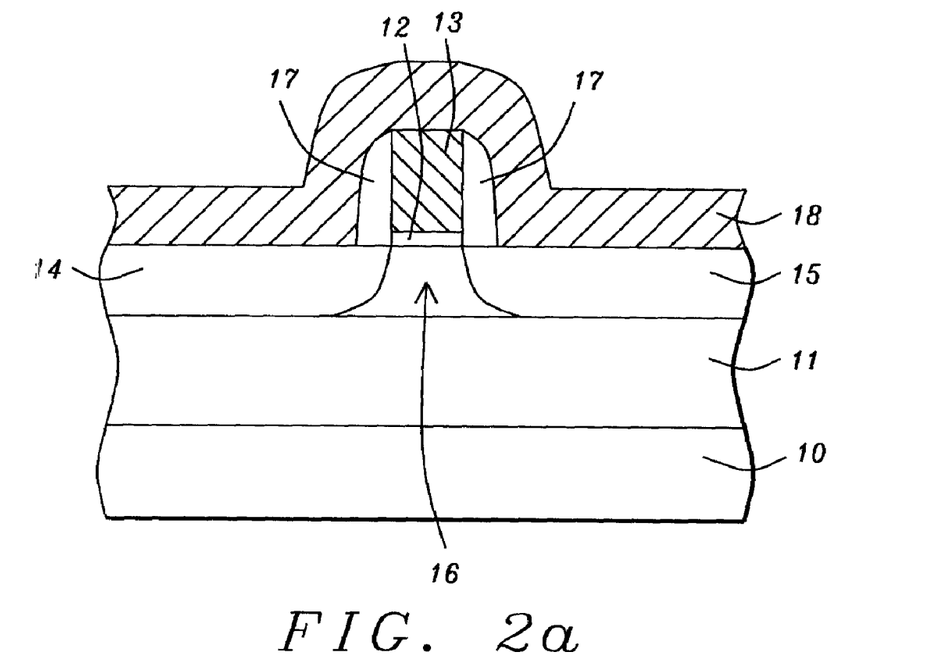
FIGS. 2a-2b are cross-sectional views that show the simultaneous silicidation of a gate electrode and source/drain regions in an SOI transistor according to prior art.
Figure 2B:
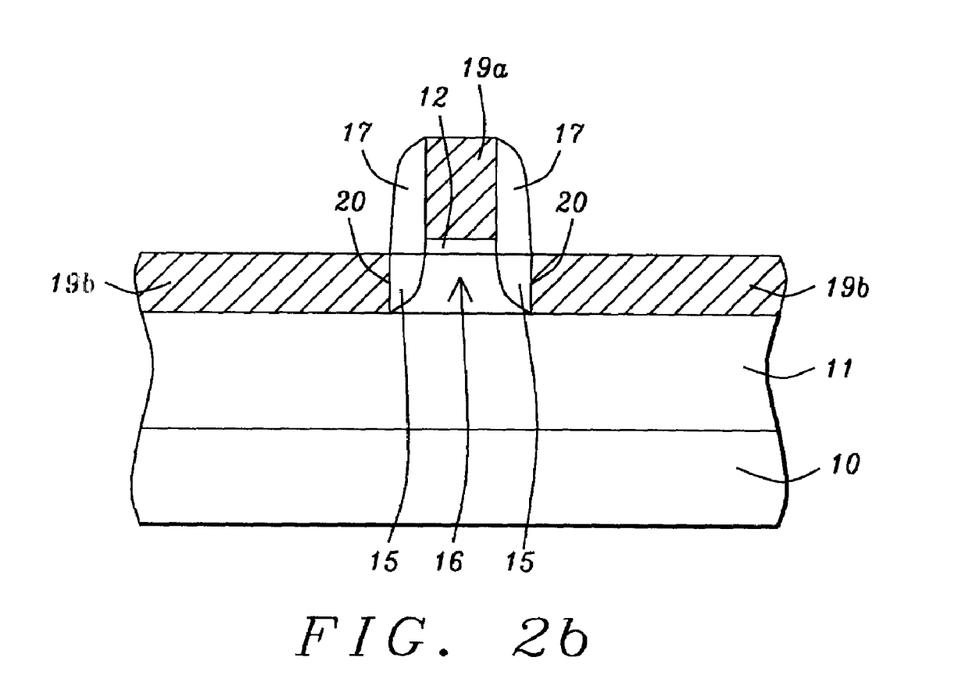

In silicon-on-insulator (SOI) technology, the source/drain regions are formed above an insulator layer, allowing a significant reduction in the source and drain depletion capacitance. In FIGS. 2a-2b, a prior art method of forming a fully silicided gate in a transistor based on SOI technology is depicted. Referring to FIG. 2a, a metal film 18 is deposited over a transistor structure having a polysilicon gate electrode 13, gate dielectric layer 12, and sidewall spacers 17 in addition to a source region 14, a drain region 15, and a channel 16 formed on an insulating layer 11 on a substrate 10. Referring to FIG. 2b, an anneal is performed to effect the silicidation process and form thick silicide regions 19b in addition to the silicided gate 19a. Note that the contact area 20 between source/drain regions 14, 15 and silicided regions 19b is reduced in size which leads to a high contact resistance. The high series resistance associated with fully silicided source and drain regions must be overcome before SOI technology is implemented in manufacturing.

A recent improvement in the design of transistor devices involves raised source and drain regions which increases the thickness of the source and drain regions available for the silicidation process and lowers sheet resistance of the source and drain regions. An example of elevated source/drain regions that are combined with a metal gate electrode is found in U.S. Pat. No. 6,284,609 in which a doped epitaxial growth serves as a raised source/drain region. A metal gate is enclosed on the sides and bottom by a gate oxide layer.

In U.S. Pat. No. 6,518,154, two different metal gates are formed on a substrate, one on a p-type (PMOS) transistor and one on an n-type (NMOS) transistor. Spacers are fabricated after the gates are formed.

Similarly, in U.S. Pat. No. 6,545,324, two different metal gate transistors are formed on a substrate. The first metal gate is comprised of a first metal and the second metal gate which is thicker includes a first metal and a thin layer of a second metal.

A silicide gate transistor is described in U.S. Pat. No. 6,465,309 in which a dummy gate between two spacers is removed. A silicon oxynitride gate dielectric layer, an amorphous silicon layer, and a metal layer are sequentially deposited to fill the opening. An anneal at 400° C. to 800° C. affords a fully silicided gate electrode.

In related prior art found in U.S. Pat. No. 6,475,874, a recess formed by removing a dummy gate between two spacers is partially filled with a high k dielectric layer and an amorphous silicon layer. After a chemical mechanical polish (CMP) step, a metal such as nickel is deposited and a low temperature silicidation is performed.

A fully depleted FET with raised source/drain regions is disclosed in U.S. Pat. No. 6,406,951 and in U.S. Pat. No. 6,551,885 in which a recess is formed between raised source/drain regions by removing an insulator layer. A gate dielectric layer is conformally deposited in the recess followed by formation of spacers along the sidewalls and then depositing a conductive material which is subsequently planarized. However, silicidation occurs only in the raised source/drain regions.

In U.S. Pat. No. 6,525,378, raised source/drain regions are formed adjacent to spacers that are on opposite sides of a gate electrode and dielectric layer. During silicidation of the raised source/drain regions, only the top portion of the gate electrode forms a silicide.

Although the prior art includes several examples of transistors that have at least two of the technology elements that include SOI substrates, raised source/drains, and fully silicided recessed gates, to our knowledge there is no method that incorporates all three elements into a single fabrication scheme. Therefore, a transistor based on these three technology elements is needed in order to meet the requirements of high performance devices that have sub –100 nm gate lengths.

SUMMARY OF THE INVENTION

An objective of the present invention is to provide a transistor structure with an SOI substrate, raised source/drain regions, and a fully silicided gate for improved performance in a semiconductor device.

A further objective of the present invention is to provide a method for fabricating an SOI transistor with a fully silicided gate that is recessed in one embodiment and not recessed in a second embodiment in order to eliminate boron penetration and gate depletion that is associated with conventional polysilicon gates.

A still further objective of the present invention is to provide a method of forming two different types of metal silicide gates in a transistor that has raised source/drain regions and an SOI substrate.

Yet another objective of the present invention is to decouple the silicidation of the gate and the source/drain regions in a method that achieves full silicidation of a non-recessed gate electrode without degrading the resistance or junction leakage characteristics of the source and drain regions.

These objectives are achieved in a first embodiment by providing a substrate with an insulating layer and a semiconductor layer formed thereon. Isolation regions are formed in the semiconductor layer to define an active region. A gate dielectric layer and a polysilicon layer are deposited on the isolation regions and active regions and are subsequently patterned by conventional photolithography and etching techniques to form a gate electrode and a gate dielectric layer on the active region. A spacer is formed on each of the two sides of the gate electrode and dielectric layer. Next, a mask comprised of a dielectric layer such as silicon oxide is formed above the gate electrode by depositing a dielectric layer on the substrate, patterning a photoresist layer to shield the dielectric layer above the gate electrode, and then selectively etching away the unprotected dielectric layer.

Raised source/drain regions are formed on the semiconductor layer between a spacer and an adjacent isolation region by selective epitaxial growth of a semiconductor material such as silicon, silicon-germanium (SiGe) or silicon-germanium-carbon (SiGeC). A first metal layer is deposited on the substrate and annealed to fully silicide the raised source/drain regions. Unreacted first metal layer is removed by a suitable etchant. A contact stop layer and an interlevel dielectric (ILD) layer are deposited on the partially formed transistor and a CMP step is employed to thin the ILD layer and remove the mask so that the ILD layer is coplanar with the top of the spacers. A second metal layer which may be comprised of the same metal used to form the first metal layer is deposited on the ILD layer and gate and then a second anneal is performed to effect a silicidation of the gate electrode. The selection of the second metal may in part depend on whether the channel in the active region has a p-type or an n-type conductivity. Unreacted second metal layer is removed by a suitable etchant. As a result, a fully silicided gate is formed in an SOI transistor having silicided raised source/drain regions.

In a second embodiment, a gate electrode comprised of a polysilicon layer and an underlying gate dielectric layer are formed between two spacers on a first semiconductor layer on an SOI substrate as in the first embodiment. Alternatively, the gate electrode may be a metal nitride, metal oxide, or an alloy. A second semiconductor layer is deposited on the gate electrode, spacers, and on the first semiconductor layer. Next, a CMP step thins the second semiconductor layer so that it is coplanar with the top of the spacers and gate electrode. A photoresist layer is coated on the substrate and patterned to expose the second semiconductor layer over the isolation regions. Once the uncovered second semiconductor layer is etched away and the photoresist is removed, the remaining second semiconductor layer and the gate electrode are simultaneously etched back. As a result, raised source/drain regions are formed in the second semiconductor layer and the height of the gate electrode is recessed to a level that is less than the adjacent spacer height.

A metal layer comprised of one or more of Ni, Co, W, Ta, Pt, Er, and Pd is deposited on the substrate and an anneal is performed to effect the formation of a fully silicided recessed gate and silicided raised source/drain regions. Unreacted metal is then removed by a suitable etchant to complete the fabrication process. The resulting transistor structure is ready for further processing that may include depositing an interlevel dielectric layer on the substrate and forming contacts to the silicided recessed gate electrode and to the silicided raised source/drain regions. The scope of this embodiment includes forming a first fully silicided recessed gate in a PMOS SOI transistor while simultaneously forming a second fully silicided recessed gate in an adjacent NMOS SOI transistor on the same substrate. In this embodiment, the metal silicide gates are made from the same metal in both NMOS and PMOS transistors.

In a third embodiment, the metal in the fully silicided recessed gate of a PMOS SOI transistor is different than the metal in the fully silicided recessed gate of an adjacent NMOS SOI transistor. The process of the second embodiment is carried through the step of simultaneously etching back the gate electrode and second semiconductor layer to form raised source/drain regions and recessed gate electrodes on adjacent and partially formed NMOS and PMOS transistors. A first protective oxide layer is deposited on the substrate and then a photoresist is coated and patterned to selectively cover the PMOS transistor. The exposed protective oxide layer on the NMOS transistor is removed by a wet etch, for example. The photoresist is stripped and a first metal layer is deposited on the substrate. A first anneal is performed to form a first metal silicided recessed gate and silicided raised source/drain regions on the NMOS transistor. Unreacted first metal is removed by an etchant. A second protective oxide layer is deposited on the substrate followed by coating a second photoresist layer and selectively patterning to leave the photoresist over the NMOS transistor. The first and second protective oxide layers over the PMOS transistor are removed by a wet etch and then the second photoresist layer is stripped. A second metal layer is deposited on the substrate and a second anneal is performed to form a fully silicided recessed gate electrode and silicided raised source/drain regions on the PMOS transistor. Unreacted second metal is removed by an etchant and then the second protective oxide layer is removed by a wet etch to complete the fabrication scheme. Preferably, the first anneal should have a temperature that is higher than or equal to the temperature of the second anneal step.

The present invention is also a transistor structure formed by a method of the first, second, or third embodiment. The transistor is comprised of a fully silicided gate electrode, silicided raised source/drain regions, and has an insulator layer formed below a first semiconductor layer in the substrate.

BRIEF DESCRIPTION OF THE DRAWINGS

The present invention is illustrated by way of example and not limitation in the accompanying figures, in which like references indicate similar elements, and in which.

DETAILED DESCRIPTION OF THE INVENTION

The present invention generally relates to semiconductor devices with gate electrodes, also referred to as gates, that are fully silicided. More particularly, the invention relates to a transistor having the technology elements of an SOI substrate, a fully silicided gate, and silicided, raised source/drain regions. However, the invention is also useful in forming a transistor that is derived from a bulk semiconductor substrate. In the preferred first embodiment set forth in FIGS. 3a-3e, the silicidation of the gate electrode is decoupled from the silicidation of the raised source/drain regions.

Figure 3A:
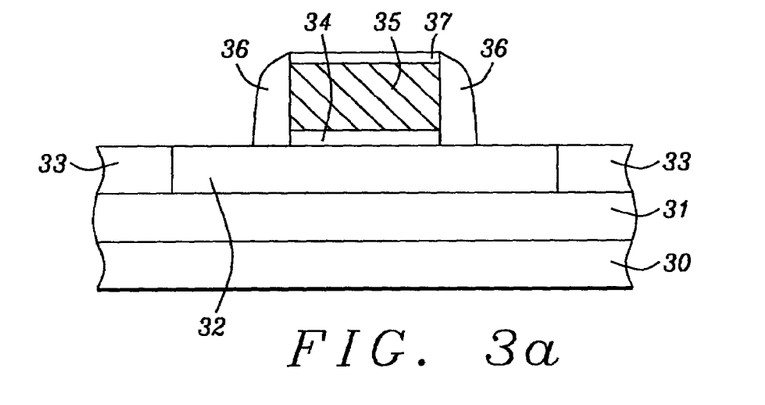
FIGS. 3a-3e are cross-sectional views illustrating the formation of a fully silicided gate electrode in a SOI transistor having fully silicided and raised source/drain regions according to a first embodiment of the present invention.

Referring to FIG. 3a, there is shown a silicon-on-insulator (SOI) substrate that includes a substructure 30, a buried insulator layer 31, and a first semiconductor layer 32. Substructure 30 may contain other active and passive devices that are not shown in order to simplify the drawing. A substrate may be referred to as a chip when the substrate is comprised of more than one device. The buried insulator layer 31 is preferably silicon oxide and has a thickness from about 100 to 5000 Angstroms. The first semiconductor layer 32 has a thickness between about 10 and 1000 Angstroms and includes either a p-well or an n-well (not shown) with a channel having a first conductivity type (p-type or n-type). In addition, there are doped source/drain extension regions (not shown) formed on opposite sides of the channel in a p-well or an n-well that have the opposite conductivity type to that of the adjacent channel.

In one embodiment, the first semiconductor layer 32 is elemental in nature and is comprised of silicon. Optionally, the first semiconductor layer 32 may be an alloy such as silicon-germanium (SiGe) or a compound semiconductor such as silicon-germanium-carbon (SiGeC). When a PMOS transistor is being fabricated on the first semiconductor layer 32, the channel beneath gate dielectric layer 34 will have an n-type conductivity while the adjacent source/drain extension regions will contain a p-type dopant. Alternatively, the structure shown in FIG. 3a may be a partially formed NMOS transistor having a first semiconductor layer 32 comprised of a channel with a p-type conductivity and adjacent source/drain extension regions doped with an n-type impurity.

Isolation regions 33 are formed in the first semiconductor layer 32 by a conventional method and are preferably shallow trench isolation (STI) features which are filled with silicon oxide or a low k dielectric material. Alternatively, other types of isolation regions known in the art may be formed such as mesa isolation regions. An active region that includes an n-well or a p-well is formed between two isolation regions 33. Isolation regions 33 may be coplanar with the first semiconductor layer 32 as pictured in the drawings, slightly elevated above the first semiconductor layer, or slightly recessed below the first semiconductor layer.

Also shown are a gate dielectric layer 34, a gate layer 35 hereafter referred to as gate electrode, and spacers 36 formed on the sidewalls of the gate electrode and gate dielectric layer. The gate dielectric layer 34 with a thickness of about 5 to 100 Angstroms and the gate electrode 35 with a thickness of about 100 to 2000 Angstroms are typically patterned by conventional lithography and etching techniques that may include a trim etch to form a gate length $L_G$ that is smaller than can be achieved by a lithography method followed by an anisotropic etch. In one embodiment, the gate dielectric layer 34 is one or more of silicon oxide, silicon oxynitride, and silicon nitride and is deposited by a CVD or plasma enhanced CVD (PECVD) technique.

Optionally, the gate dielectric layer 34 may be comprised of one or more high k dielectric materials with a dielectric constant (permittivity) of greater than about 6 such as $Ta_2O_5$, $TiO_2$, $Al_2O_3$, $ZrO_2$, $HfO_2$, $Y_2O_3$, $La_2O_5$ and their aluminates and silicates which are deposited by a CVD, metal organic CVD, or an atomic layer deposition method. A high k dielectric material enables an increase in the effective oxide thickness (EOT) of the gate dielectric layer 34 to suppress tunneling current and prevent a high gate leakage current. However, a high k dielectric layer generally has a lower thermal stability than silicon oxide, silicon nitride, or silicon oxynitride, and is employed only when subsequent thermal processes may be restricted to temperatures that do not exceed the thermal stability limit of the high k dielectric material. In an alternative embodiment, the gate dielectric layer 34 is comprised of a high k dielectric layer formed on an interfacial layer that is $SiO_2$, silicon nitride, or silicon oxynitride.

The gate electrode 35 is a conductive material such as polysilicon, a metal, an alloy, a metallic nitride, or a conductive metal oxide and is deposited by a CVD, PECVD, or physical vapor deposition (PVD) process. During the formation of the gate electrode 35, a mask layer 37 is formed on the gate electrode by a well known method that generally involves depositing a mask layer on the substrate and then patterning a photoresist (not shown) to protect the portion of the mask layer above the gate electrode 35 which allows unprotected portions of the mask layer to be removed by a suitable etchant. The mask layer 37 therefore serves to protect the gate electrode 35 during the gate etching process. Moreover, the mask layer 37 protects the gate electrode 35 during subsequent epitaxy and silicidation steps.

Spacers 36 may be comprised of a dielectric material such as silicon nitride, silicon oxide, silicon oxynitride or combinations thereof and are generally formed by a CVD or PECVD method which deposits a layer of the dielectric material on the first semiconductor layer 32 and over the gate dielectric layer 34 and gate electrode 35. A second step which is an anisotropic etch is used to remove thinner portions of the dielectric layer and leave thicker portions of the dielectric layer as spacers 36. Preferably, the mask layer 37 has a thickness between about 50 and 500 Angstroms and is a different material than used in the spacers 36 so that the mask layer may be selectively removed in the presence of the spacers in a later CMP step. For example, if the spacers 36 are silicon nitride, then the mask layer 37 may be silicon oxide.

Figure 3B:
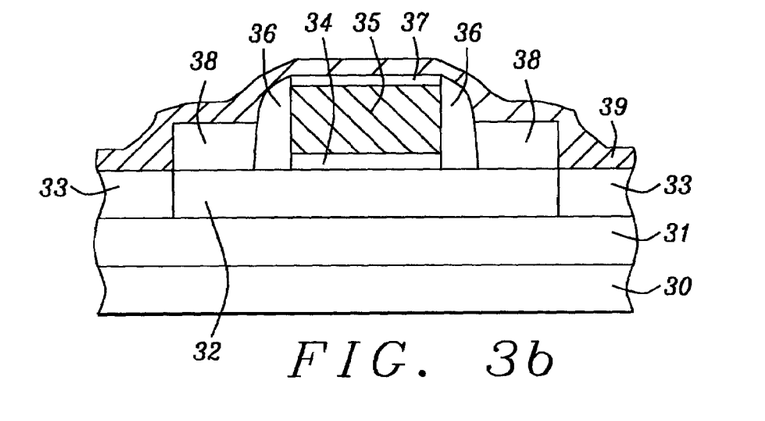

Referring to FIG. 3b, a selective epitaxy is then performed at a temperature in the range of about 350° C. to 950° C. to grow a second semiconductor layer that is hereafter referred to as raised source/drain regions 38 with a thickness of about 50 to 1500 Angstroms above the top of the first semiconductor layer 32. The composition of the raised source/drain regions 38 may be silicon, SiGe, or SiGeC. When the raised source/drain regions 38 are comprised of SiGe, the preferred amount of Ge in the SiGe layer is between 15% and 95%. In the embodiment where the raised source/drain regions 38 are comprised of SiGeC, the preferred Ge content is between about 15% and 95% and the preferred carbon content is from about 0.1% to 5%.

A key feature of the first embodiment involves decoupling the silicidation of the raised source/drain regions 38 from the silicidation of the gate electrode 35 in order to avoid the prior art problem discussed earlier with regard to FIG. 2b. A first metal is deposited by a CVD or physical vapor deposition (PVD) method to form a first metal layer 39 that covers exposed portions of isolation regions 33, raised source/drain regions 38, spacers 36, and mask layer 37. The first metal is one or more of Ni, Co, W, Ta, Pt, Er, Hf, Al, and Pd. Alternatively, other metallic materials may be used. A first anneal is performed by heating the partially formed transistor structure at 200° C. to 800° C. for a period of about 0.1 to 200 seconds. The mask layer 37 prevents the gate electrode 35 from reacting with the first metal layer 39.

Figure 3C:
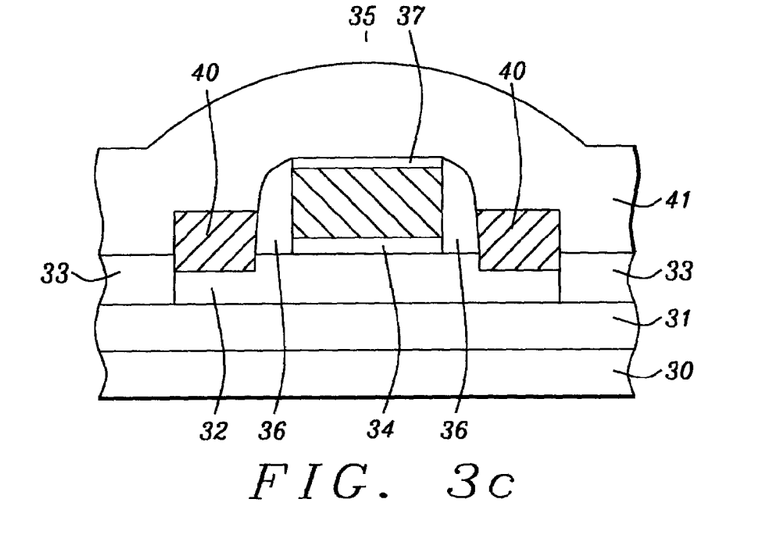

Referring to FIG. 3c, the unreacted first metal layer 39 is removed from the partially formed transistor by a suitable etchant such as sulfuric acid or nitric acid, for example. Raised source/drain regions 40 are shown that are fully silicided. Note that the thickness of the silicided, raised source/drain regions 40 is typically about 50 to 500 Angstroms larger than the thickness of raised source/drain regions 38 before the anneal because of the incorporation of the first metal. Moreover, the silicidation process may extend into the first semiconductor layer 32. As a result, the raised, silicided source/drain regions 40 may have a bottom that is lower than an adjacent spacer 36.

A dielectric stack 41 comprised of a lower contact stop layer (not shown) and an upper dielectric layer (not shown) is deposited on the substrate by a CVD or PECVD process. The contact stop layer which is preferably silicon carbide, silicon oxynitride, or silicon nitride serves as an etch stop during subsequent formation of contacts to the raised, silicided source/drain regions 40 and has a thickness of about 100 to 1000 Angstroms. The dielectric layer has a thickness of from about 200 to 2000 Angstroms and is comprised of silicon oxide, phosphosilicate glass (PSG), borophosphosilicate glass (BPSG), or a low k dielectric material such as fluorine doped silicon oxide or carbon doped silicon oxide. When the dielectric stack 41 includes a low k dielectric layer, the stack may be heated up to about 600° C. or subjected to a plasma treatment to stabilize and densify the low k dielectric layer.

Figure 3D:
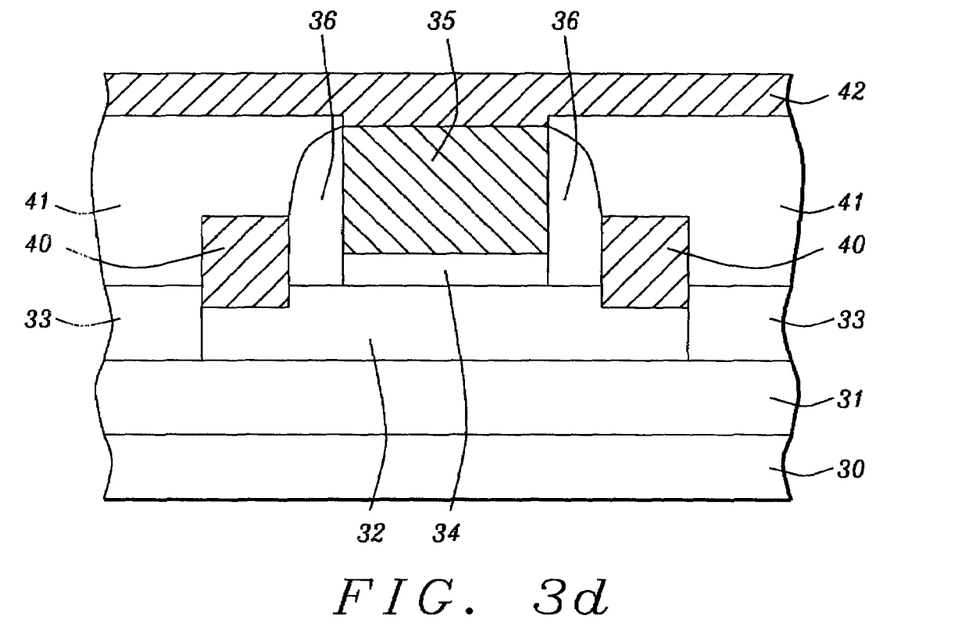

Referring to FIG. 3d, a CMP step is performed to lower the dielectric stack 41 which becomes coplanar with the gate electrode 35. Note that the mask layer 37 is preferably removed in the CMP step. Optionally, the CMP step stops on mask layer 37 and the mask layer is removed in the following step by a plasma etch or wet etch method that leaves the gate electrode 35 uncovered.

Next, a second metal layer 42 is deposited by a CVD or PVD technique on the dielectric stack 41 and gate electrode 35. In one embodiment, the second metal is the same as the first metal used in the first metal layer 39. Optionally, the second metal is one or more of Ni, Co, W, Ta, Pt, Er, Hf, Al, and Pd but is not the same metal used to form the metal silicide in the raised, silicided source/drain regions 40. A second anneal is performed to effect the silicidation of the gate electrode 35. The temperature of the second anneal should not be above a temperature that is known to degrade the first metal silicide in raised, silicided source/drain regions 40.

Figure 3E:
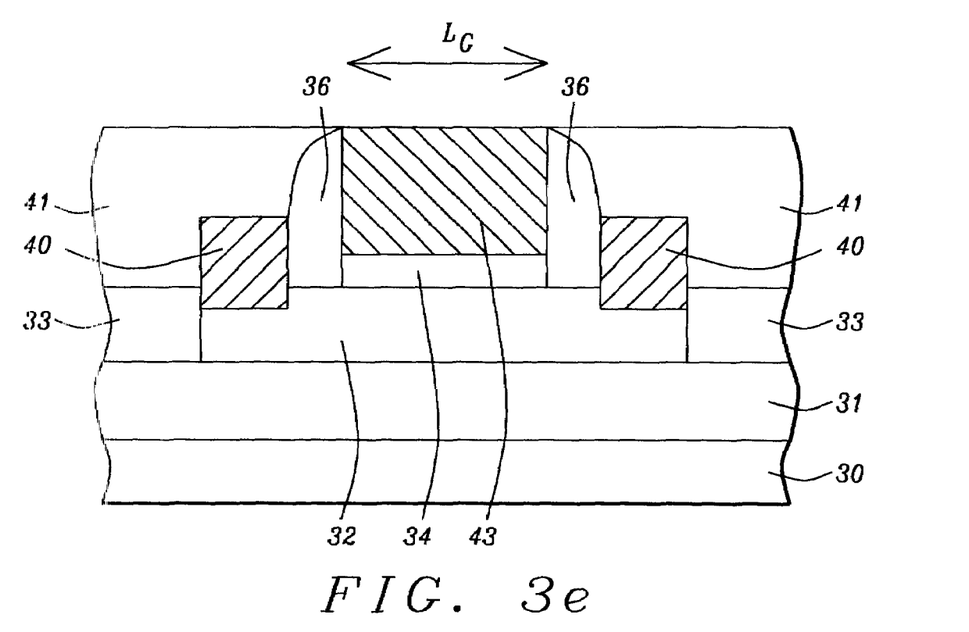

Referring to FIG. 3e, unreacted portions of the second metal layer 42 are removed by a suitable etchant. As a result, a fully silicided gate electrode 43 that is comprised of a second metal silicide is formed. The thickness of the fully silicided gate electrode 43 may be greater than the thickness of gate electrode 35 before the second anneal because of incorporating the second metal into the silicide. Thus, the top of gate electrode 43 may be above the top surface of dielectric stack 41 but the gate length ($L_G$) is unchanged.

In the alternative embodiment in which the gate electrode 35 is comprised of a metal nitride, metal, alloy, or a conductive metal oxide, the process of the first embodiment may end after the first silicidation to form raised silicided source/drain regions 40 and the formation of a second metal layer above the gate electrode 35 may be omitted.

The present invention according to the first embodiment has an advantage over prior art in that three technology elements each associated with a particular benefit is incorporated into a transistor structure. The fully silicided gate electrode eliminates the gate depletion effect observed with conventional polysilicon gates and results in increased capacitance and increased inversion charge density for improved transistor performance. Additionally, a raised source/drain region improves the silicidation process window and sheet resistance in the source/drain region. Since the silicidation of the raised source/drain regions is performed separately from siliciding the gate electrode, full silicidation of the gate electrode is achieved without degrading the junction leakage characteristics of the raised source/drain regions.

The present invention is also the SOI transistor structure formed by the method of the first embodiment. The transistor is comprised of a substrate which has an insulating layer formed on a substructure and a semiconductor layer formed on the insulating layer. The semiconductor layer includes isolation regions, a channel, and source/drain extension regions adjacent to the channel. The transistor further includes a gate dielectric layer formed above the channel and a fully silicided gate electrode comprised of a first metal overlying the gate dielectric layer. Optionally, the gate electrode is comprised of a metal nitride, a metal, an alloy, or a conductive metal oxide. Spacers are formed on the sidewalls of the gate electrode and gate dielectric layer. A silicided raised source or drain region comprised of a second metal is formed adjacent to each spacer and extends laterally to the edge of an isolation region. The silicide in the raised source/drain regions may be the same or different than the silicide in the gate electrode and comprises one or more of Ni, Co, W, Ta, Pt, Er, Hf, Al, or Pd. Optionally, silicided gate electrode and raised source/drain regions may be comprised an alloy silicide such as SiGe. The transistor may be further comprised of a dielectric stack that includes a lower contact stop layer on the isolation regions, on the raised silicided source/drain regions, and on the spacers and an essentially planarized dielectric layer on the contact stop layer that is about coplanar with the top of the gate electrode and spacers.

A second embodiment of the present invention is a method of fabricating a transistor with a fully silicided, recessed gate electrode in combination with raised source/drain regions that are fully silicided. The method begins with the previously described partially formed transistor shown in FIG. 3a and is continued in FIGS. 4a-4d.

Figure 4A:
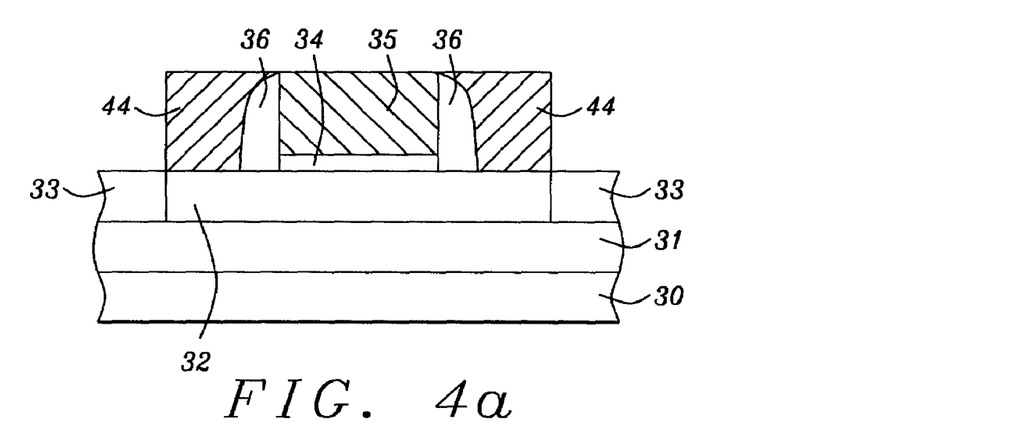
FIGS. 4a-4d are cross-sectional views showing the formation of a fully silicided and recessed gate electrode in an SOI transistor having fully silicided and raised source/drain regions according to a second embodiment of the present invention.

Referring to FIG. 4a, a second semiconductor layer 44 is preferably selectively deposited by a CVD process on the partially formed transistor structure depicted in FIG. 3a to a thickness that is higher than the spacers 36 and gate electrode 35. The second semiconductor layer 44 is preferably polysilicon but may be amorphous silicon, an alloy such as SiGe, or a compound such as SiGeC. Furthermore, the second semiconductor layer 44 may have a non-planar surface in which the layer is thicker over gate electrode 35 than over the isolation regions 33. A CMP step known to those skilled in the art may be performed to planarize the second semiconductor layer 44 so that the layer is coplanar with the top of the gate electrode 35 and spacers 36.

Figure 4B:
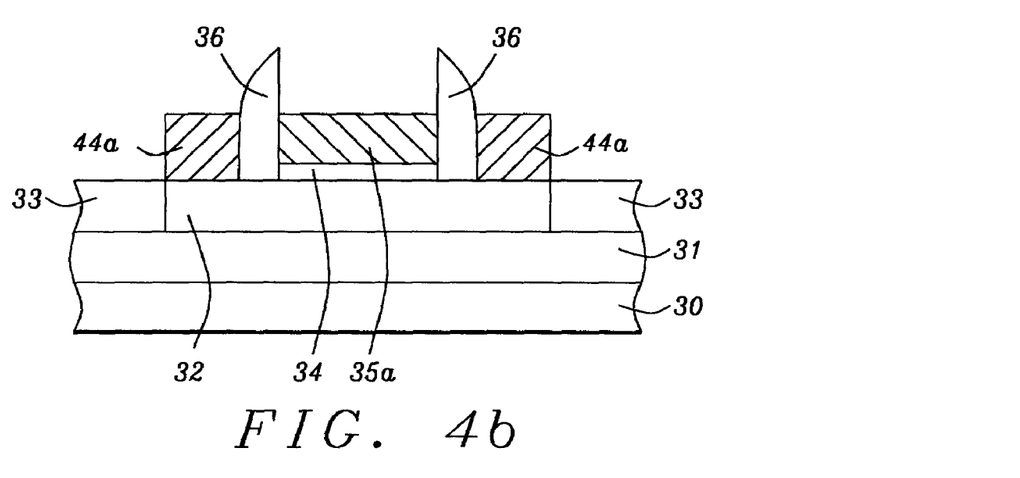

Referring to FIG. 4b, the second semiconductor layer 44 is etched back by a suitable plasma etch. When the second semiconductor layer 44 is polysilicon, the plasma etch may be comprised of $Cl_2$, HBr, and $O_2$, for example. The thickness of the second semiconductor layer 44 on the first semiconductor layer 32 is reduced by about 5% to 70% to form raised source/drain regions 44a. Note that the thickness of the gate electrode 35 is also reduced by about 5% to 70% during the plasma etch to form a recessed gate electrode. Although the recessed gate electrode 35a is shown as coplanar with raised source/drain regions 44a, coplanarity may not be achieved if gate electrode 35a is comprised of a different material than raised source/drain regions 44a.

In the embodiment where the second semiconductor layer 44 is comprised of a different material than the gate electrode 35, the etch rate of the gate electrode may be faster or slower than that of the second semiconductor layer. In other words, the thickness of the recessed gate electrode 35a may be higher or lower than the thickness of the raised source/drain regions 44a. Note, however, that when the gate electrode 35 is polysilicon and the second semiconductor layer 44 is SiGe or SiGeC, the recessed gate electrode may be about coplanar with the raised source/drain regions 44a because of a similar etch rate for polysilicon and SiGe or SiGeC.

Figure 4C:
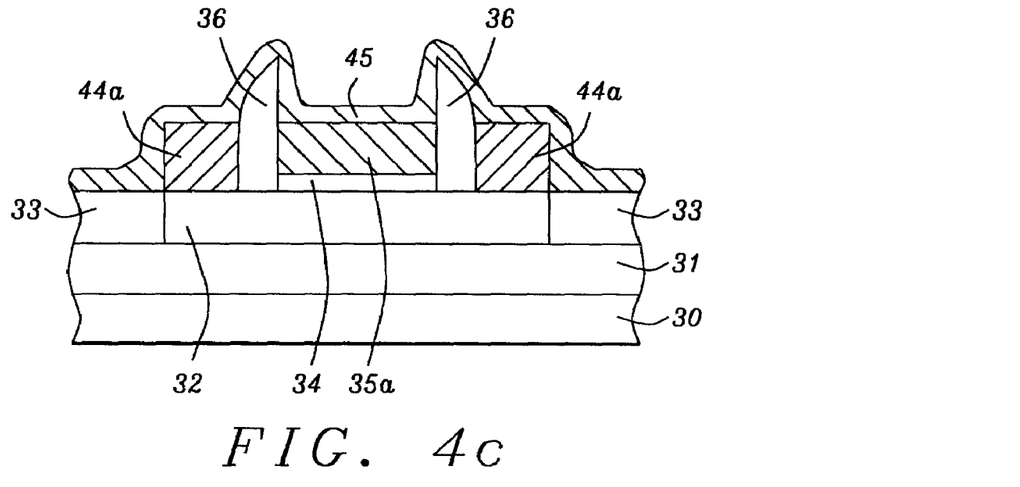

Referring to FIG. 4c, a metal is deposited on the isolation regions 33, spacers 36, raised source/drain regions 44a, and on the recessed gate electrode 35a by a CVD or PVD technique or the like to form a metal layer 45. The metal layer 45 is comprised of one or more of Ni, Co, W, Ta, Pt, Er, Hf, Al, and Pd or other metals and preferably has a thickness of about 20 to 500 Angstroms but it is understood that a thickness outside the aforementioned range may be used.

Figure 4D:
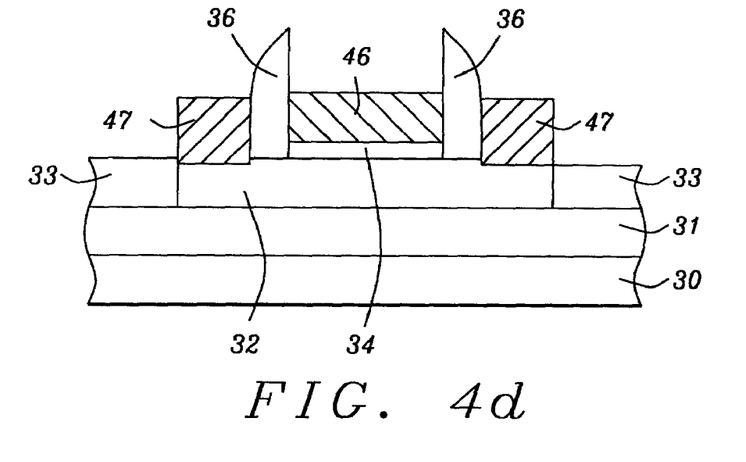

Referring to FIG. 4d, a rapid thermal anneal (RTA) is performed at a temperature of about 200° C. to 800° C. for a period of about 0.1 to 200 seconds to effect a silicidation of the raised source/drain regions 44a and of recessed gate electrode 35a. As a result, a fully silicided, recessed gate electrode 46 and fully silicided, raised source/drain regions 47 are formed. Note that the silicidation may extend slightly into the first semiconductor layer 32 such that the bottom of a fully silicided, raised source/drain region 47 is below the bottom of an adjacent spacer 36. In the embodiment where the metal layer 45 has a thickness of about 20 to 500 Angstroms, the thickness of the fully silicided, raised source drain regions 47 and of the fully silicided, recessed gate electrode may be about 20 to 500 Angstroms thicker than the raised source/drain regions 44a and recessed gate electrode 35a, respectively, because of the incorporation of the metal layer during the RTA. The unreacted metal layer 45 is removed by a suitable etchant such as sulfuric acid or nitric acid. It is understood that the suicide in the recessed gate electrode 46 may be different than the silicide in the raised source/drain regions 47. For instance, the fully silicided, recessed gate electrode 46 may be nickel silicide while the fully silicided, raised source/drain regions 47 may be comprised of Ni, Si, and Ge or Ni, Si, Ge, and C.

The advantages of the second embodiment are the same as mentioned for the first embodiment with the exception that a simultaneous silicidation of a gate electrode and raised source/drain regions are performed in the second embodiment which requires fewer process steps. However, the resistance or junction leakage characteristics of the raised source/drain regions are not degraded during a full silicidation of the gate electrode because the thickness of the recessed gate electrode is approximately the same as that of the recessed source/drain regions. In other words, the silicidation of the recessed gate electrode is completed at about the same time as the silicidation of the raised source/drain regions so that the silicidation reaction extends only minimally into the first semiconductor layer adjacent to the isolation regions.

The present invention is also a semiconductor device as shown in FIG. 4d that comprises a transistor formed on a substrate as described with reference to FIGS. 4a-4d. The substrate is based on a substructure that includes an insulating layer and a semiconductor layer formed thereon. The semiconductor layer includes isolation regions, a channel that has a conductivity type, and source/drain extension regions adjacent to the channel which have a conductivity type opposite to that of the channel. The transistor further includes a gate dielectric layer formed over the channel, a fully silicided gate electrode on the gate dielectric layer, spacers formed adjacent to the gate dielectric layer and fully silicided gate electrode which extend above the top of the fully silicided gate electrode, and raised source/drain regions that are fully silicided. A fully silicided raised source region is between one of the spacers and an adjacent isolation region while a fully silicided raised drain region is between the other of the spacers and an adjacent isolation region. In one embodiment the silicide in the gate electrode is comprised of a first metal and polysilicon and the silicide in the raised source/drain regions is comprised of a first metal and SiGe or SiGeC.

A third embodiment is depicted in FIGS. 5a-5e and is similar to the second embodiment except the scope of the second embodiment is expanded with the understanding that the method as described through FIG. 4b may be employed to fabricate a PMOS transistor adjacent to an NMOS transistor on a substrate. The method begins with the previously described partially formed transistor shown in FIG. 4b having an adjacent partially formed transistor as pictured in FIG. 5a.

Figure 5A:
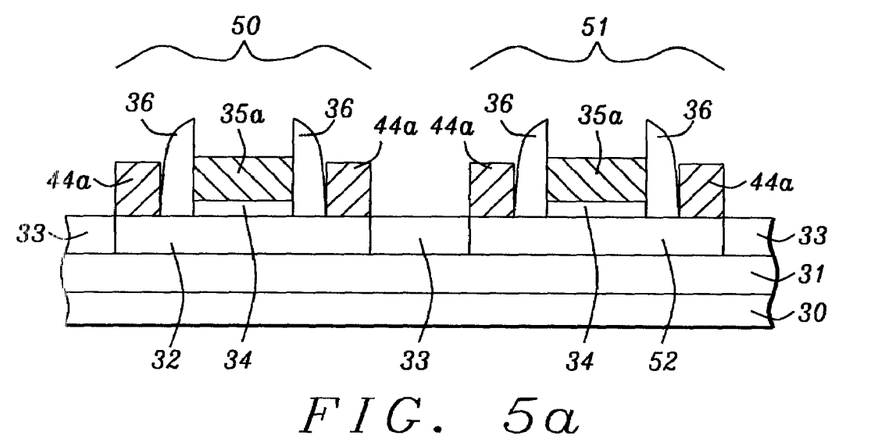
FIGS. 5a-5e are cross-sectional views showing the formation of an NMOS SOI transistor adjacent to a PMOS SOI transistor in which the fully silicided and recessed gate electrode and raised S/D regions of the NMOS transistor are comprised of a different metal than the fully silicided and recessed gate electrode and raised S/D regions in the PMOS transistor according to a third embodiment of the present invention.

Referring to FIG. 5a, there is shown a partially formed PMOS transistor 50 that is equivalent to the previously described transistor structure in FIG. 4b. In this example, semiconductor layer 32 has a channel doped with an n-type impurity (not shown) and source/drain extension regions (not shown) doped with a p-type impurity that are adjacent to the channel. Adjacent to the PMOS transistor 50 is a partially formed NMOS transistor 51 that was in large part simultaneously fabricated during the previously described sequence in the second embodiment that produced a PMOS transistor 50 as appreciated by those skilled in the art. The NMOS transistor 51 has a semiconductor layer 52 with a channel doped with a p-type impurity (not shown) and source/drain extension regions (not shown) that are adjacent to the channel and which are doped with an n-type impurity. The NMOS transistor 51 has the same raised source/drain regions 44a, spacers 36, gate dielectric layer 34 and gate electrode 35a as in PMOS transistor 50. Optionally, the gate electrode 35a for the NMOS transistor may have a different dopant than the gate electrode 35a for the PMOS transistor.

It is understood that in the final semiconductor device, it is important to match the threshold voltages of NMOS and PMOS transistors. With conventional polysilicon gates, this is typically done by adjusting the dopant in source/drain regions. In the third embodiment, threshold voltage is matched by selecting an appropriate metal silicide for the gate electrode and raised source/drain regions in the NMOS and PMOS transistors. The third embodiment expands the scope of the second embodiment by enabling a first metal to be incorporated into the fully silicided recessed gate electrode and fully silicided raised source/drain regions of an NMOS transistor and a second metal to be incorporated into the fully silicided recessed gate electrode and fully silicided raised source/drain regions of a PMOS transistor.

Figure 5B:
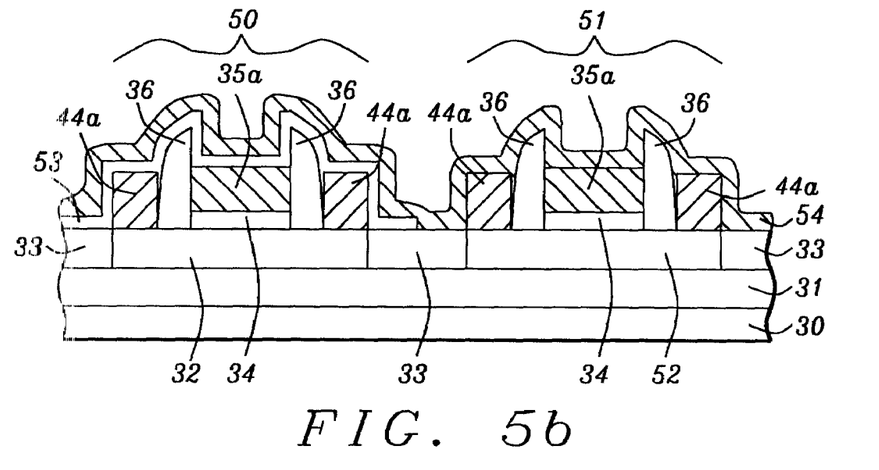

Referring to FIG. 5b, a first protective layer 53 that may be a conformal silicon oxide layer with a thickness of about 20 to 500 Angstroms, for example, is deposited on the PMOS transistor 50, the NMOS transistor 51, and on the isolation regions 33 by a CVD or PECVD technique. The first protective layer 53 will serve to prevent a metal layer from reacting with raised source/drain regions 44a and the recessed gate electrode 35a in the PMOS transistor 50 during a subsequent silicidation of selected portions of the NMOS transistor 51. A photoresist layer (not shown) is coated on the substrate and patterned to uncover the first protective layer 53 over the NMOS transistor 51. The exposed first protective layer 53 is removed over the NMOS transistor 51 by a wet etch such as HF, for example. The remaining photoresist layer is stripped to leave the first protective layer 53 only on the PMOS transistor 50 and on portions of the isolation regions 33.

In the following step, a first metal that is preferably one of Hf, Er, or Al is deposited by a CVD or PVD method on the first protective layer 53, on portions of the isolation regions 33, and on the NMOS transistor 51 to give a first metal layer 54. Alternatively, the first metal may be one of Ni, Co, W, Ta, Pt, or Pd. An RTA similar to the anneal described in the second embodiment is performed to effect the full silicidation of the recessed gate electrode 35a and of the raised source/drain regions 44a in the NMOS transistor 51. As mentioned previously, the recessed gate electrode 35a may be comprised of a different semiconductor layer than the raised source/drain regions 44a. As an example, the gate electrode 35a may be a polysilicon layer while the raised source/drain regions 44a may be comprised of SiGe or SiGeC.

Figure 5C:
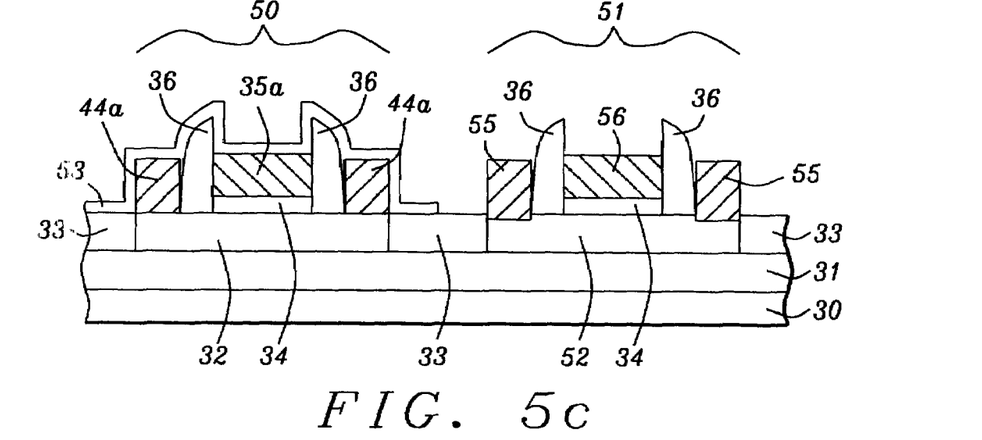

Referring to FIG. 5c, the unreacted first metal layer 54 is removed by a suitable etch as described previously. As a result, the first protective oxide layer 53 remains on the PMOS transistor 50 and a fully silicided recessed gate electrode 56 in addition to fully silicided raised source/drain regions 55 are formed in the NMOS transistor 51.

Figure 5D:
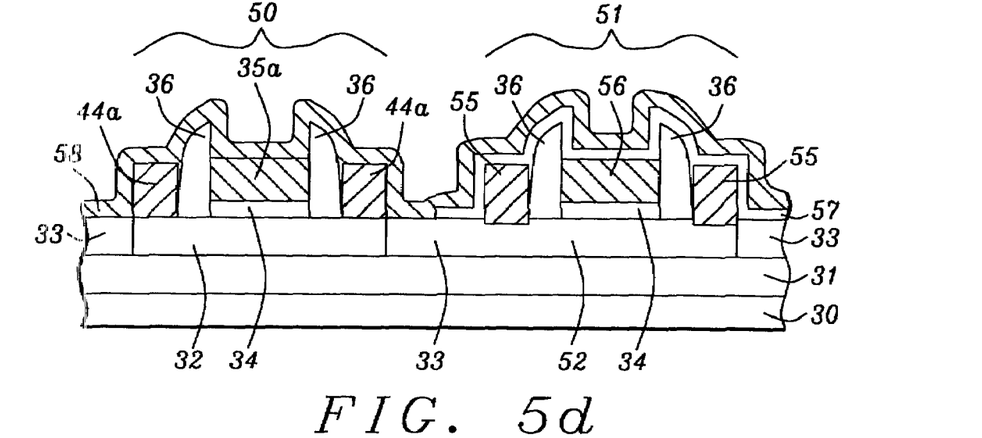

Referring to FIG. 5d, a second protective layer 57 is deposited on the first protective layer 53 over PMOS transistor 50, on portions of the isolation regions 33, and on the NMOS transistor 51 and preferably has the same composition and a similar thickness to that of the first protective layer 53. Next, a photoresist layer (not shown) is coated on the second protective layer 57 and patterned to uncover the second protective layer 57 over the PMOS transistor 50. An etch is employed to remove exposed portions of the second protective layer 57 and the underlying first protective layer 53 in the PMOS transistor 50 and leaves the second protective layer 57 on the NMOS transistor 51 and over portions of the isolation regions 33. There is a slight overlap of the second protective layer 57 on the isolation regions 33 to compensate for a possible misalignment during the patterning of the photoresist layer. When the first protective layer 53 and the second protective layers 57 are silicon oxide, then a dilute HF solution may be used to remove the exposed protective layers. The remaining photoresist layer is removed by an O.sub.2 ashing or with a wet stripper solution.

A second metal that is preferably a less reactive metal such as Pt or Pd is deposited on the second protective layer 57 and on the PMOS transistor 50 to give a second metal layer 58. Alternatively, the second metal may be one of Ni, Co, W, Ta, Al, Hf, or Er. Preferably, the second metal layer 58 has a different composition than the first metal layer 54 employed earlier but has a similar thickness to first metal layer of about 20 to 500 Angstroms. A second anneal step that is similar to the first anneal step is performed to effect the silicidation of the recessed gate electrode 35a and raised source/drain regions 44a in the PMOS transistor 50.

Optionally, the order of silicidation of the NMOS and PMOS transistors may be reversed if the metal layer on the NMOS transistor forms a silicide at a lower temperature than the metal layer on the PMOS transistor. In other words, a higher temperature silicidation is preferably executed before a lower temperature silicidation to avoid degradation of the low temperature silicide during a high temperature process.

Figure 5E:
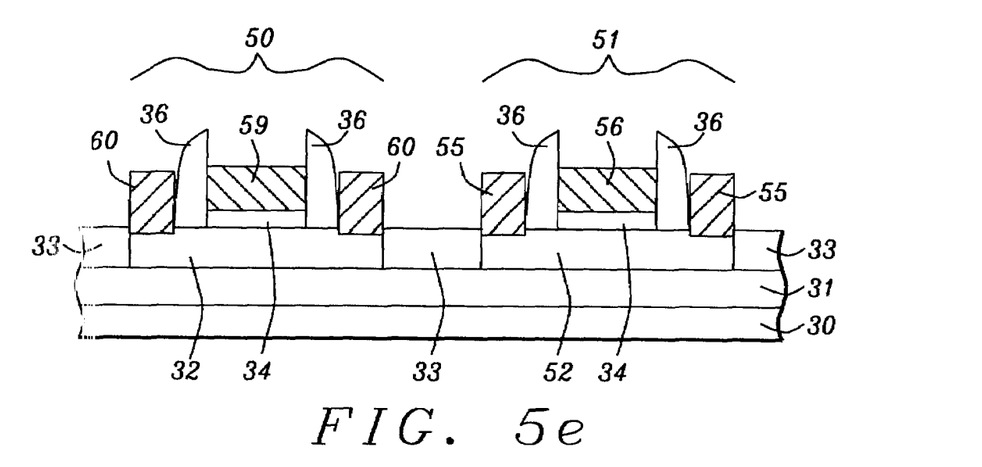

Referring to FIG. 5e, the unreacted second metal layer 58 is removed by a suitable etchant and then the second protective layer 57 is removed by the same method as applied to remove the first protective layer 53. As a result, a fully silicided recessed gate electrode 59 in addition to fully silicided raised source/drain regions 60 are formed in the PMOS transistor 50 and have a thickness between about 100 and 2000 Angstroms above the semiconductor layer 32 At this point, the PMOS transistor 50 and the NMOS transistor 51 are ready for further processing such as deposition of an interlevel dielectric layer on the substrate and formation of contacts to fully silicided recessed gate electrodes 56, 59 and/or to the fully silicided raised source/drain regions 55, 60.

The advantages of the third embodiment of the present invention are the same as those stated for the second embodiment. In addition, the method of the third embodiment provides more flexibility in that the threshold voltage (Vt) for the PMOS transistor may be separately adjusted from the Vt for the NMOS transistor by selecting different metals for the two silicidation steps. In this manner, the Vt for a PMOS transistor may be more evenly matched to the Vt of an adjacent NMOS transistor.

The present invention is also a semiconductor device as shown in FIG. 5e that comprises a PMOS transistor formed adjacent to an NMOS transistor on a substrate as previously described with respect to FIGS. 5a-5e. The substrate is based on a substructure on which an insulating layer and a first semiconductor layer are sequentially formed. The first semiconductor layer includes isolation regions, an n-type channel adjacent to p-type source/drain extension regions in the PMOS transistor, and a p-type channel adjacent to n-type source/drain extension regions in the NMOS transistor. The PMOS transistor further includes a gate dielectric layer formed on the first semiconductor layer between isolation regions, a fully silicided, recessed first gate electrode comprised of a first metal on the gate dielectric layer, a first set of spacers formed adjacent to the gate dielectric layer and to the fully silicided recessed first gate electrode which extend above the top of the first gate electrode, and fully silicided, raised first source/drain regions comprised of the first metal. A first raised source region is formed between one of the first set of spacers and an adjacent isolation region while the first raised drain region is between the other of the first set of spacers and an adjacent isolation region.

The NMOS transistor further includes a gate dielectric layer formed on the first semiconductor layer between isolation regions, a fully silicided, recessed second gate electrode comprised of a second metal on the gate dielectric layer, a second set of spacers formed adjacent to the gate dielectric layer and to the fully silicided, recessed second gate electrode which extend above the top of the second gate electrode, and fully silicided raised second source/drain regions comprised of the second metal. A second raised source region is formed between one of the second set of spacers and an adjacent isolation region while the second raised drain region is between the other of the second set of spacers and an adjacent isolation region. The silicide in the fully silicided, recessed first and second gate electrodes and in the fully silicided first and second raised source/drain regions may be comprised of an alloy such as SiGe or may be comprised a compound silicide such as SiGeC.

While this invention has been particularly shown and described with reference to, the preferred embodiments thereof, it will be understood by those skilled in the art that various changes in form and details may be made without departing from the spirit and scope of this invention.

What is claimed is:

1. A semiconductor chip, comprising:
    a substrate that includes a semiconductor layer overlying an insulator layer formed on a substrate substructure, said semiconductor layer having a first active region and an adjacent second active region;
    a gate dielectric layer overlying the first active region and a fully silicided first gate electrode comprised of a first metal formed thereon;
    a first pair of spacers formed adjacent to said gate dielectric layer and the overlying first gate electrode such that the first gate electrode is recessed below the top of the first pair of spacers;
    a first raised source region between one of the first pair of spacers and an adjacent isolation region and a first raised drain region between the other of the first pair of spacers and an adjacent isolation region wherein the first raised source/drain regions are comprised of the first metal and are fully silicided;
    a gate dielectric layer overlying the second active region and a fully silicided second gate electrode comprised of a second metal formed thereon;
    a second pair of spacers formed adjacent to the gate dielectric layer and the overlying second gate electrode such that the second gate electrode is recessed below the top of the second pair of spacers; and
    a second raised source region between one of the second pair of spacers and an adjacent isolation region and a second raised drain region between the other of the second pair of spacers and an adjacent isolation region wherein the second raised source/drain regions are comprised of the second metal and are fully silicided and wherein the second metal includes a different composition than the first metal.

2. The semiconductor chip of claim 1 wherein the insulator layer is silicon oxide with a thickness between about 100 and 5000 Angstroms.

3. The semiconductor chip of claim 1 wherein the semiconductor layer is silicon with a thickness from about 10 to 1000 Angstroms.

4. The semiconductor chip of claim 1 wherein the gate dielectric layer is silicon oxide, silicon oxynitride, or silicon nitride, or a high k dielectric material with a permittivity greater than about 6.

5. The semiconductor chip of claim 1 wherein at least one of either the first metal or the second metal is from a group consisting of Ni, Co, W, Ta, Pt, Er, Hf, Al, and Pd.

6. The semiconductor device of claim 1 wherein the gate dielectric layer has a thickness of about 5 to 100 Angstroms.

7. The semiconductor device of claim 1 wherein the first and second fully silicided raised source/drain regions and the fully silicided recessed first and second gate electrodes have a thickness between about 100 and 2000 Angstroms above the semiconductor layer.

* * * * *